(12) United States Patent
Anderson

(10) Patent No.: US 7,536,669 B1
(45) Date of Patent: May 19, 2009

(54) GENERIC DMA IP CORE INTERFACE FOR FPGA PLATFORM DESIGN

(75) Inventor: James Bryan Anderson, Santa Cruz, CA (US)

(73) Assignee: Xilinx, Inc., San Jose, CA (US)

( * ) Notice: Subject to any disclaimer, the term of this patent is extended or adjusted under 35 U.S.C. 154(b) by 252 days.

(21) Appl. No.: 11/513,565

(22) Filed: Aug. 30, 2006

(51) Int. Cl.
*G06F 17/50* (2006.01)
*G03F 13/36* (2006.01)

(52) U.S. Cl. .............................. 716/16; 716/1; 716/17; 710/308

(58) Field of Classification Search .................... 716/16, 716/17; 710/22, 305, 308
See application file for complete search history.

(56) References Cited

U.S. PATENT DOCUMENTS

| | | | |
|---|---|---|---|
| 6,378,050 B1 * | 4/2002 | Tsuruta et al. | 711/149 |
| 6,810,442 B1 * | 10/2004 | Lin et al. | 710/22 |
| 7,110,437 B2 * | 9/2006 | Oates et al. | 375/147 |
| 7,216,328 B2 * | 5/2007 | Hwang et al. | 716/16 |
| 7,266,632 B2 * | 9/2007 | Dao et al. | 710/317 |
| 2003/0204702 A1 * | 10/2003 | Lomax et al. | 711/207 |
| 2007/0168908 A1 * | 7/2007 | Paolucci et al. | 717/100 |
| 2008/0109775 A1 * | 5/2008 | Norman | 716/5 |

OTHER PUBLICATIONS

Kim et al.; "Implementation of the 3-view MPEG-2 encoder/decoder using the FastImage 1300 board"; Nov. 18-19, 2004; Intelligent Signal Processing and Communication Systems, 2004. ISPACS 2004. Proceedings of 2004 International Symposium on; pp. 384-389.*

Morton et al.; "A236 parallel DSP chip provides real-time video processing economically and efficiently"; Apr. 30-May 2, 1996; ELECTRO '96. Processional Program. Proceedings; pp. 261-268.*

* cited by examiner

*Primary Examiner*—Helen Rossoshek
(74) *Attorney, Agent, or Firm*—Thomas A. Ward; LeRoy D. Maunu

(57) ABSTRACT

A Direct Memory Access (DMA) system is provided for simplified communication between a processor and IP cores in an FPGA. The DMA system includes use of dual-port BRAM as a buffer and a decoder as a DMA control signal identification mechanism. The DMA control signals are stored in an area of the BRAM memory recognized by the decoder using chip enable (CE), write enable (WE), and address (ADR) signals. The decoder, upon recognizing a DMA control signal, will generate an event vector. The event vector triggers a READ operation by the receiving device at the associated BRAM control data memory address. DMA control codes can be detected as sent from either the processor or the IP core or both, depending upon whether the system employs a MASTER/SLAVE, SLAVE/MASTER, or PEER/PEER control model.

17 Claims, 9 Drawing Sheets

US 7,536,669 B1

GENERIC DMA IP CORE INTERFACE FOR FPGA PLATFORM DESIGN

BACKGROUND

1. Technical Field

Embodiments of the present invention relate to Direct Memory Access (DMA) system used for communications. More particularly, the present invention relates to a system for providing DMA communication for intellectual property (IP) cores of a programmable logic device (PLD) such as a Field Programmable Gate Array (FPGA).

2. Related Art

A common theme in FPGA-based architectural design is the interface between an embedded processor and one or more IP blocks. Communications across such interfaces typically include both data and control information. In particular, communications with IP cores generally involves movement of data and control tokens between hardware and software based Finite State Machine (FSM) elements. This communication may be achieved via typically three general approaches, (1) First In First Out (FIFO) streaming interface, (2) BUS transaction interface, and (3) DMA. Each case has advantages and disadvantages.

The first communication approach, FIFO, (First-In-First-Out), is conceptually simple. The FIFO depends on a simple streaming interface, with its associated bi-directional flow control, i.e., overflow/underflow. The FIFO is amenable to rate matching, and affords a simple hardware implementation model. This interface model is appropriate to broad dataflow processing classes of significant interest. One downside of FIFO is the parsing of control and data tokens. If simple flow control signals, (e.g., overflow, underflow), are not sufficient for the task at hand, control must be applied via a separate FIFO channel, with appropriate control/data synchronization. Further, FIFO does not permit random-access. Thus, whenever random-access is required, data must be buffered in some auxiliary RAM resource. In summary, FIFO-based streaming is most appropriate where simple serial data streaming is sufficient to the IP core processing model, and is accompanied by minimal-complexity FSM control.

FIG. 1 is a block diagram illustrating a standard bidirectional FIFO-based processor/IP core communication interface used in an FPGA. The processor shown is a Reduced Instruction Set Computer (RISC) 4, connecting to a single IP core 6. The FIFO buffers $12_{1-3}$ and $13_{1-3}$ provide a particularly simple symmetrical interface between the processor and IP core. A dual port Block RAM (BRAM) 2a of the FPGA forms the RISC processor 4 Instruction/Data memory resource. Data may then be propagated between the I/D BRAM 2a and the IP core 6 using the RISC processor 4. The control signals used between the RISC processor 4 and BRAM 2a include Chip Select (CS), and Write ENable (WEN), along with the ADdRess (ADR) and DATA transferred between the RISC 4 and BRAM 2a. The processor 4 and IP core 6 employ signals for management of the data interface, according to some streaming protocol typically implemented using the FSM 10 associated with the IP core 6. Instructions for data flow control between the RISC 4 and IP core can include: Data ReaDY (DRDY), OVerFlow (OVF), and UnDerFlow (UDF) that are transferred along with DATA information. The IP core 6 can include an FPGA BRAM memory 2b for auxiliary data or control signal storage. The FIFOs $12_{1-3}$ and $13_{1-3}$ provide a buffering function, affording some degree of asynchronous rate matching across the interface, depending upon FIFO depth, relative clock rates, and other factors. The FIFO communication technique has also been applied to streaming processor/co-processor communication models separate from an FPGA. When the processing model requires a more complex data organization, such as block-transfer, random access, or multiple buffer partitioning, using FIFOs is less efficient relative to a DMA or a BUS system.

A second communication method, using a BUS, represents an abstraction of the communications channel in form of a set of defined operations at the interface. Typical operations include READ/WRITE DATA (from/to a specified address), READ (IP Core/Channel) STATUS, WRITE (IP Core) CONTROL, READ INTERRUPT, and other operations. These operations are abstracted in the form of an Applications Programming Interface (API) that includes a set of function calls within a software programming environment. The API then implements IP Core/processor communications in form of a highly simplified procedural semantic. However, this convenience and flexibility comes at a cost. The BUS is by nature a shared resource. Thus, communications with multiple peripherals engenders arbitration, and is accompanied by a total bandwidth constraint. At high rates, arbitration typically engenders a significant overhead. To some extent generic master/slave DMA transaction and block-oriented (pipelined) data transfer may relieve bandwidth restrictions, but at a cost of significantly increased complexity and arbitration loss. Further, IP cores as BUS peripherals may require an internal rate matching buffer as means to structure data path-BUS communications. Thus, an essential doubling of required BUFFER/MEMORY resources may result, since data may be buffered on both sides of the BUS. This is in addition to hardware resources needed for BUS/BUS-Arbiter infrastructure. In sum, with multiple IP cores or peripherals, BUS transaction may engender high overhead in terms of hardware resources, control complexity, and aggregate bandwidth limitations.

FIG. 2 shows a block diagram illustrating communications between a processor 4 and IP core 6 using a standard BUS system 14. The RISC processor transfers data between the BRAM 2a and IP core 6, as in FIG. 1. Advantages of the BUS include simplification and unification of processor 4—IP core 6 communication in terms of a master/slave or peer-to-peer control model. To the extent bus arbitration overhead does not emerge as a limiting factor, another advantage the BUS offers is straightforward extensibility to multiple/diverse peripherals or IP cores 6. Disadvantages accrue primarily with regard to; (a) arbitration overhead, (b) hardware-level complexity, (c) and where burst-mode transactions are not supported, (i.e., no pipelining), there may exist significant transaction overhead. Further, data generated or consumed at the processor 4 or IP core 6 may still require rate-match buffering at the bus interface. Under such circumstances, data must again be stored in two separate locations.

A third type of communication, DMA provides high efficiency, speed, and flexibility in comparison to alternative approaches based upon FIFO streaming or BUS arbitration. The advantages of a DMA system can be extended to FPGA designs where the associated DMA controller and system components required do not significantly impact configuration resources of the FPGA. The DMA option hinges upon high-speed transfers between IP core data buffers and memory without processor intervention. Disadvantages accrue with regard to complexity, (typically a distinct control envelope for each IP core), and scalability, (too many DMA clients degrade overall memory performance). It is desirable to provide a DMA solution that addresses these disadvantages.

SUMMARY

According to embodiments of the present invention, communications between IP cores and a processor is serviced by a DMA system. Processor—IP core communications is supported with datapath and control information shared in a common memory-mapped resource, such as a dual-port BRAM. DMA control signal detection is provided through a side-channel decoder block, to allow high-speed pipelined buffer transfers. This provides significant performance advantages relative to FIFO, BUS, and traditional DMA systems.

Dual-port BRAM between a processor and an IP core buffers data and control signals transferred between a buffer memory jointly controlled by the processor and dual port BRAM memory. Control events are propagated via a signal path separate from datapath in form of a side-channel controller. The separate controller occurs in form of a decoder.

In operation, the decoder determines if a reserved BRAM memory location has been accessed. This is accomplished by detection of one or more of Chip Select (CS), Write Enable (WEN), and address (ADR) value combinations. For example, if a signal is identified as a control signal, the decoder generates an event vector that is transmitted to the receiving device (either an IP core or processor).

BRIEF DESCRIPTION OF THE DRAWINGS

Further details of the present invention are explained with the help of the attached drawings in which.

DETAILED DESCRIPTION

Figure 1:
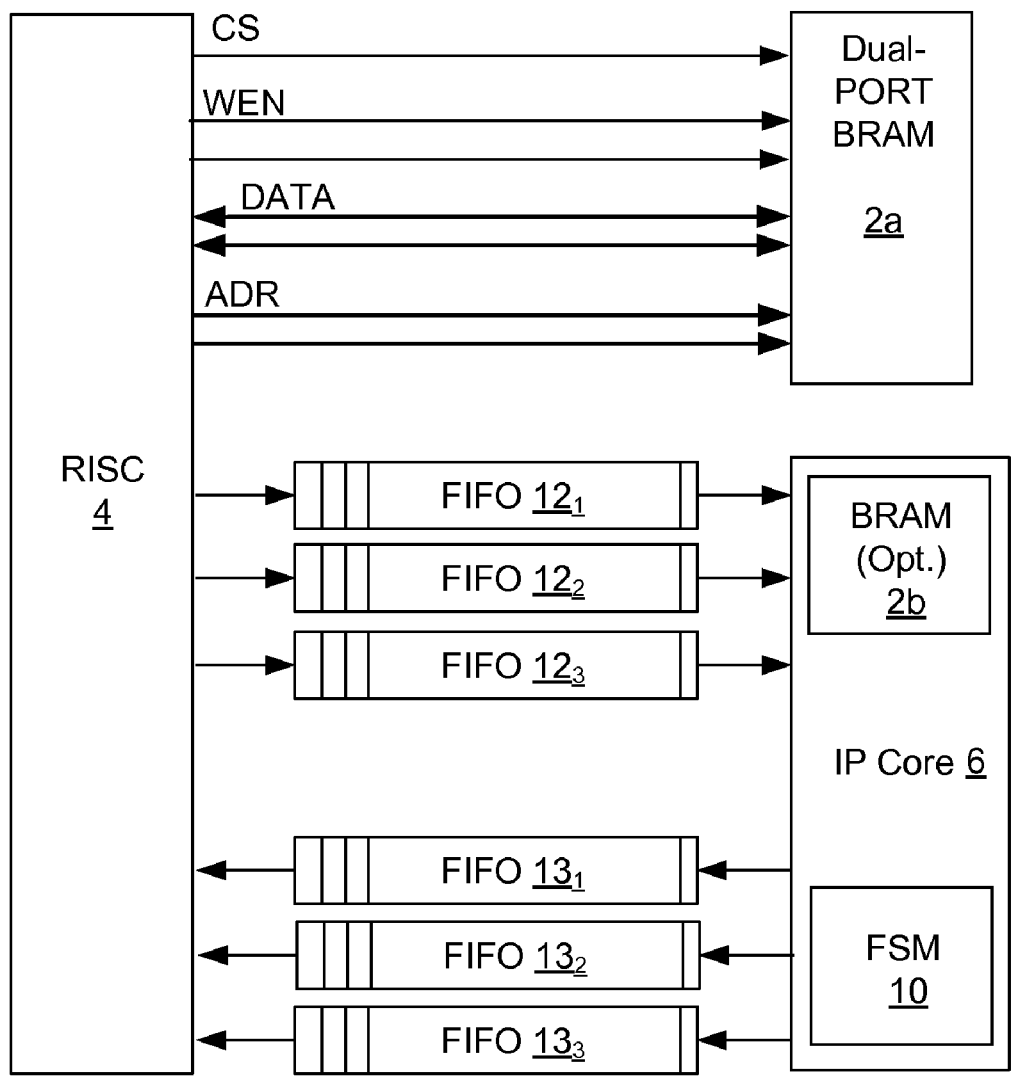
FIG. 1 is a block diagram illustrating a standard bidirectional FIFO-based processor/IP core communication interface used in an FPGA.
Figure 2:
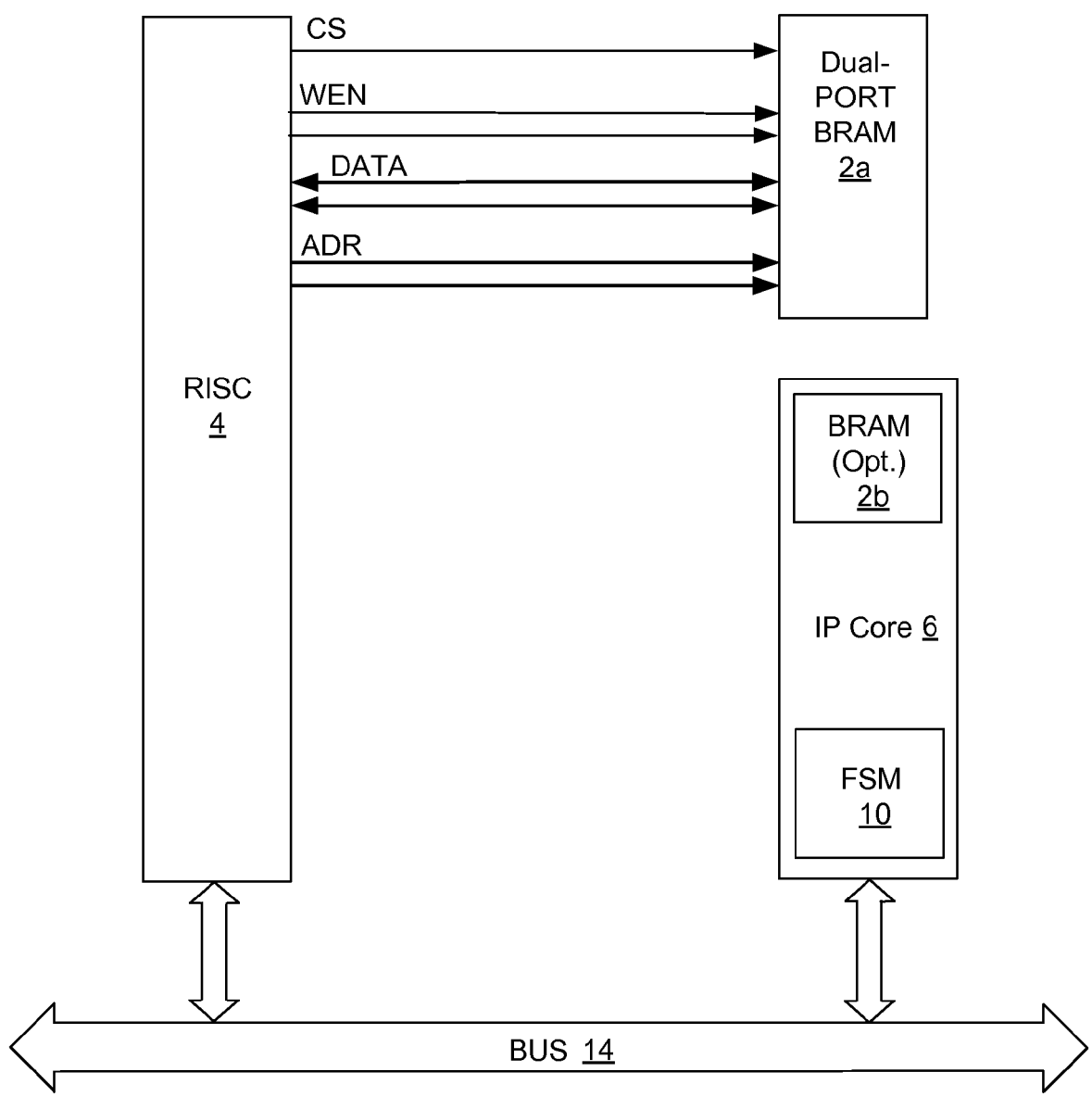
FIG. 2 shows a block diagram illustrating processor/IP core communications in an FPGA using a standard BUS system.
Figure 3:
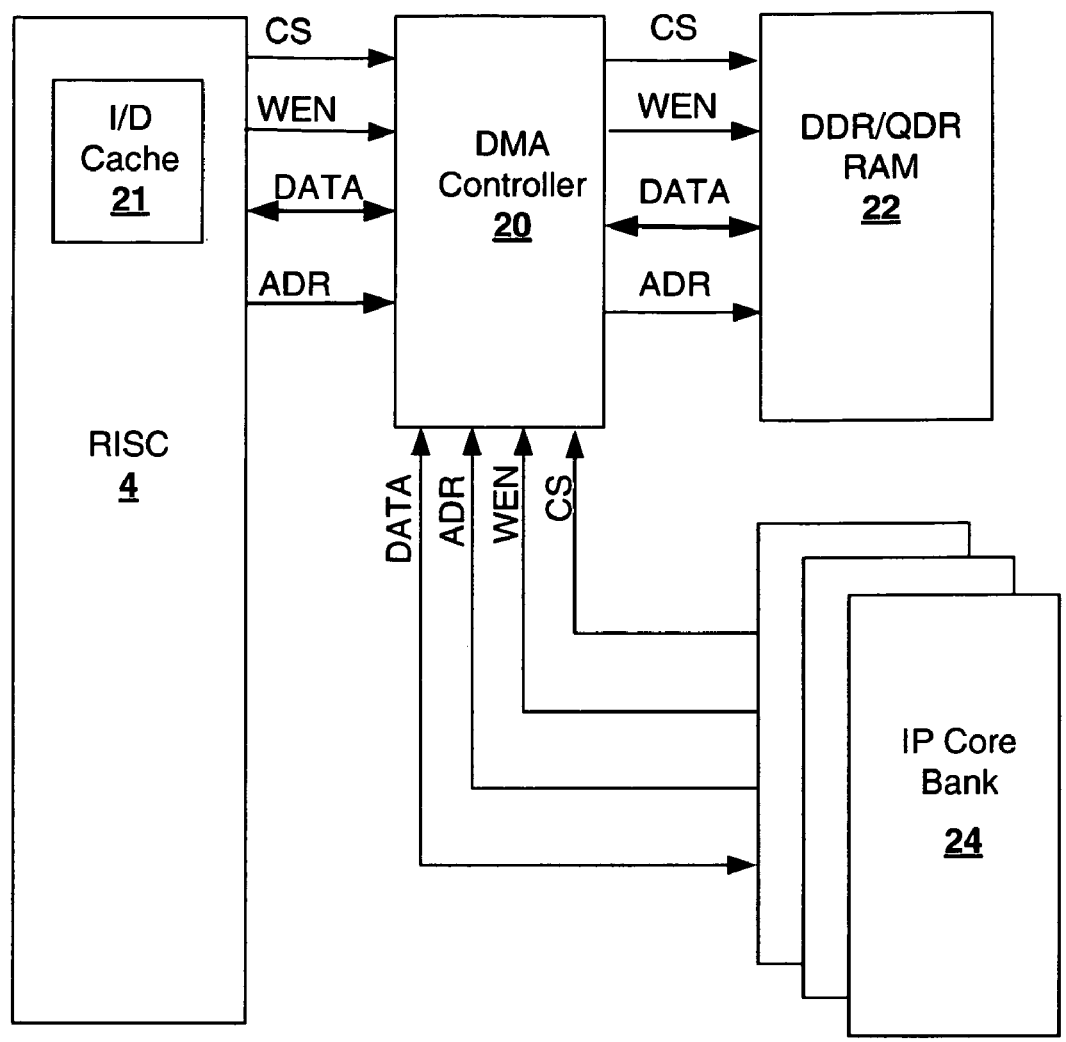
FIG. 3 shows a block diagram illustrating processor/IP core communications using a DMA interface servicing the multiple IP cores.

FIG. 3 shows a block diagram illustrating communication between a processor 4 and multiple IP cores 24 using a DMA interface. The DMA interface includes a DMA controller 20 as arbiter for all memory accesses and mediates IP core specific control signals necessary to IP core DMA operations. The DMA interface further includes a DDR/QDR memory 22 partitioned according to address block size and an offset that is accessed by the DMA controller 20. The DMA system incorporates mapping of specific memory partitions to peripheral/IP core device drivers and I/D cache 21 existing in the RISC address space. DMA also implements memory-to-memory transfers based upon the assumed memory-map without processor intervention. Data, address and control signals are employed as a basis for DMA Controller 20 regulation of data flow between the RISC processor 4, IP Core bank 24, and DDR/QDR RAM 22. Note that other types of processors may also be used. One example of a device that may include the DMA system of FIG. 3 is a video frame buffer, where video data acquired by a frame grabber peripheral interface is DMA transferred to a DDR/QDR memory and operated upon by image processing algorithms executing in the IP cores 24 as accessed by the RISC processor 4. This type of arrangement is available in principle to FPGA designers, but in spite of the performance advantages is not often used because of the highly distinct nature of DMA in this configuration, attendant complexity, and bandwidth sharing at the common memory resource 22.

Figure 4:
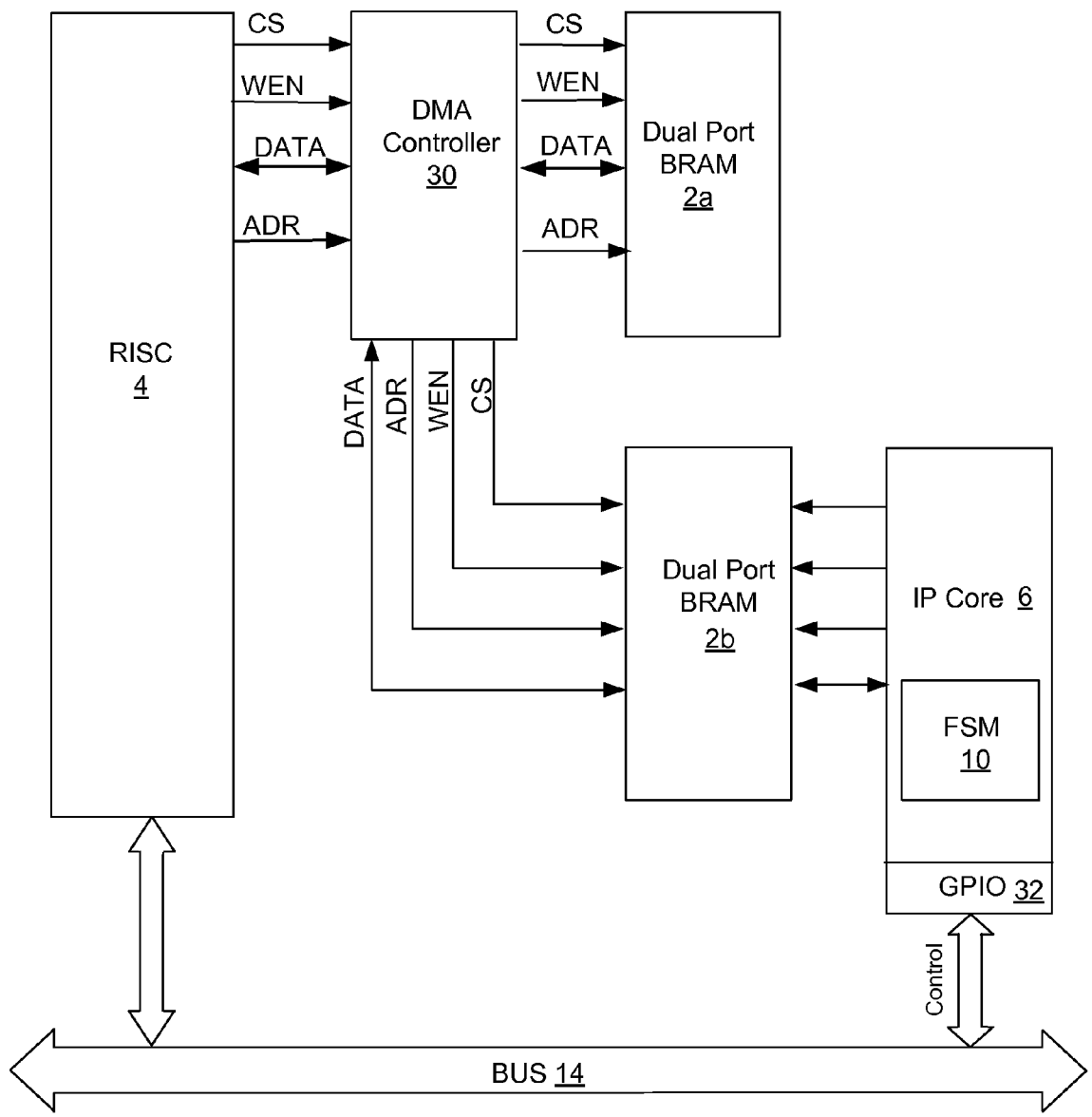
FIG. 4 shows a block diagram illustrating processor/IP core communications with a DMA interface in a FPGA formed using dual-port BRAM of the FPGA plus DMA side-channel control implemented over a bus subsystem.

In FIG. 4, one possible implementation of a memory mapped DMA existing independent of the I/D cache memory resource 21 is shown. In the configuration of FIG. 4, a bilateral DMA buffer in the form of a dual-port BRAM memory 2b of the FPGA is mapped into the address space of a RISC processor 4. This DMA is then leveraged for IP Core 6 datapath communications. The RISC processor 4 and IP core 6 process READ/WRITE access at the DMA buffer 2b on separate BRAM ports and in a common address space. The processor also accesses the I/D BRAM 2a and DMA buffer 2b memory elements in a unified address space. Address and control signals between the RISC processor 4, DMA controller 30 and BRAM storage 2a include two sets of CS, WEN, DATA and ADR, one for each I/D component. Control signals between the memory DMA controller 30 and BRAM 2b and IP core 6 include DATA, ADR, CS and WEN. Appropriate control agent synchronization is imposed such that data is not corrupted during concurrent processor/IP core addresses, namely RISC processor 4 DMA API calls in conjunction with IP core FSM DMA operations. A separate side-channel control is constructed in the form of a bidirectional GPIO bus peripheral 32, whereby a specific DMA transfer FSM protocol is implemented. In particular, the IP core FSM 10 and processor-based application are informed of processor-to-IP core/IP core-to-processor DMA transfer status via the BUS 14.

In summary, the configuration of FIG. 4 realizes many DMA performance advantages. Particularly noteworthy is: (a) data is buffered only once using BRAM 2b and (b) data transfer is rate-matched across the dual-port memory interface. However, there also exist disadvantages to this arrangement: (a) the added complexity of a bus sub-system 14 for a DMA control side-channel, (b) additional API calls at the processor associated with control word transactions at the bus interface 14, and (c) potential DMA/DMA control latency/skew issues caused by bandwidth sharing on the arbitrated bus 14.

Figure 5:
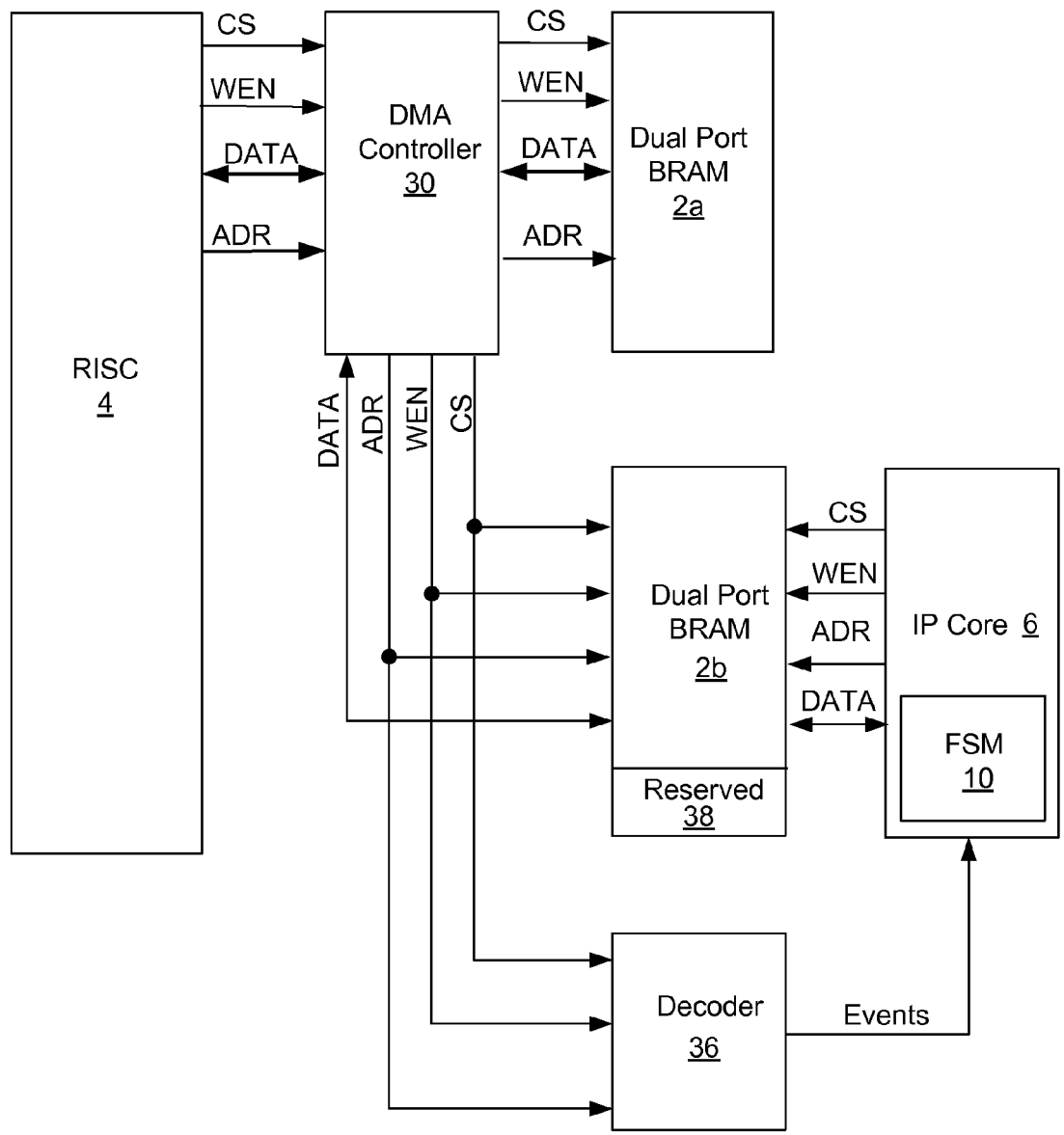
FIG. 5 illustrates one embodiment of the present invention that replaces the bus-based DMA control channel of FIG. 4 with a BRAM address/control decoder block.

FIG. 5 illustrates one embodiment of the present invention that addresses disadvantages of FIG. 4. In FIG. 5, the bus is replaced by a BRAM address/control decoder block 36. The control input to decoder 36 from DMA controller 30 includes the processor BRAM address bus (ADR), plus associated Chip Select (CS) and Write ENable (WEN) signals. Control output occurs in the form of an encoded (event) vector indicating the processor 4 has applied a READ or WRITE operation for a control operation including control code, status code, or an interrupt code to some reserved buffer region in BRAM 2b. Processor DMA control event vectors are then applied to a reserved IP core FSM control agent register file.

Figure 6:
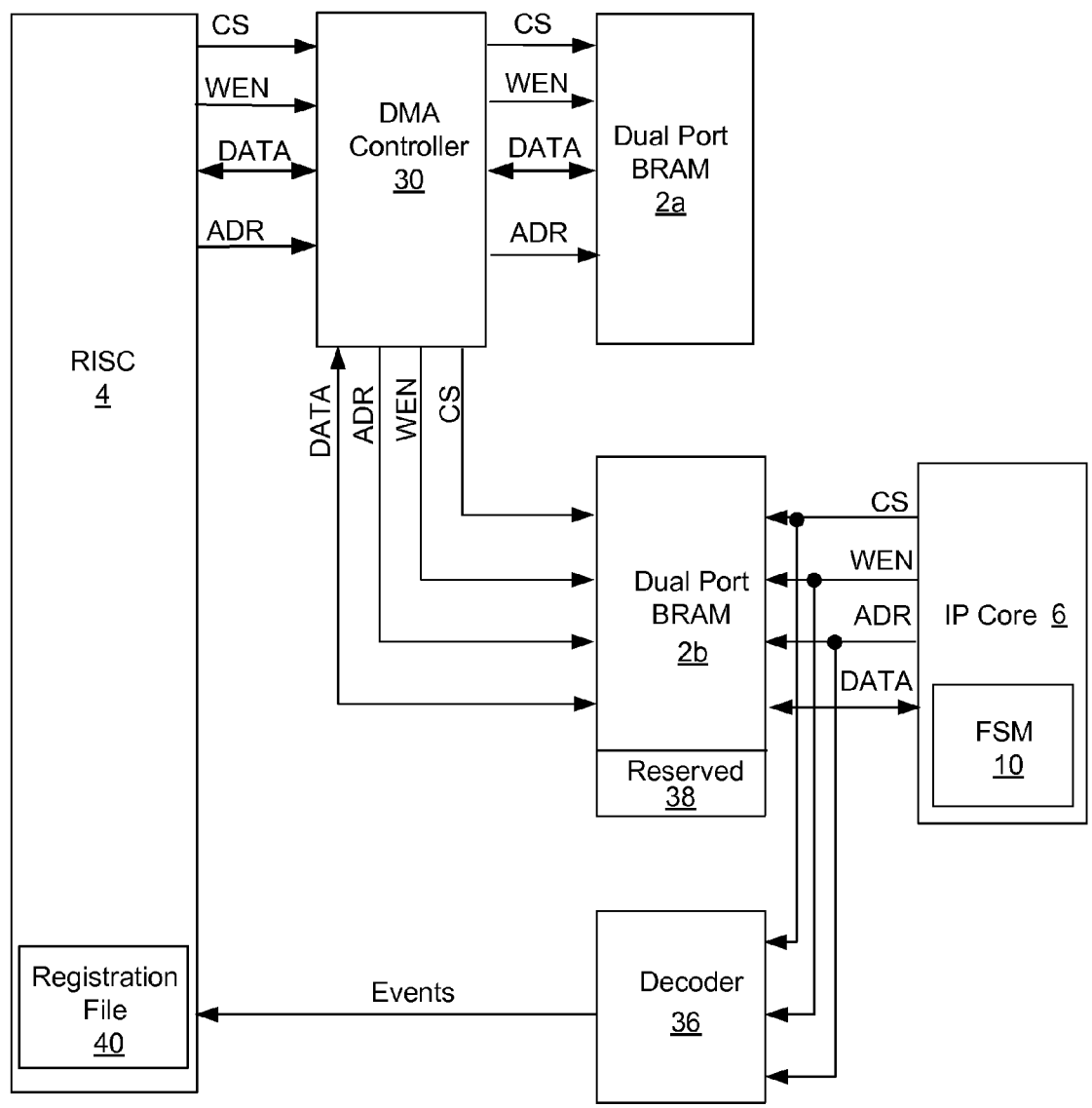
FIGS. 6-7 illustrate reconfiguration of the decoder block of FIG. 5 to provide SLAVE/MASTER or PEER-to-PEER communications.
Figure 7:
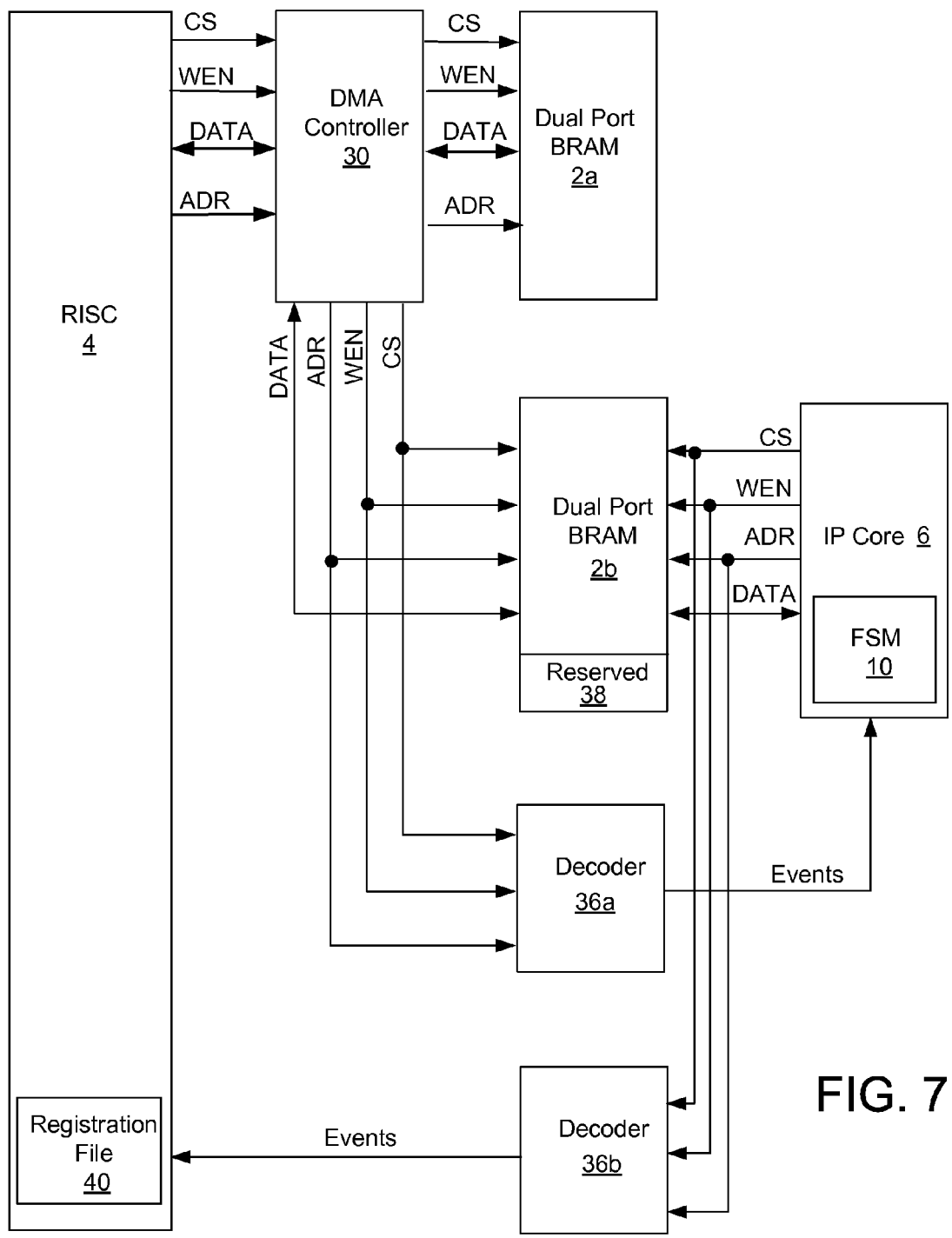

A MASTER/SLAVE communication discipline is implied between the processor and IP core displayed in FIG. 5. However, SLAVE/MASTER or PEER-to-PEER may be optionally implemented with decoding of the IP core BRAM address plus associated control signals, as indicated in FIGS. 6-7. In FIG. 6, a SLAVE/MASTER configuration is achieved with the DMA control decoder 36 input derived from the IP core and the output event vector applied to RISC processor 4 registration file 40. In FIG. 7, a PEER/PEER configuration is achieved by instancing of two separate decoders 36a and 36b to provide bilateral control between the IP core 6 and RISC processor 4, in both directions.

In the configuration of FIGS. 5-7, an address space subset 38 of the BRAM 2b is reserved for DMA CONTROL, STATUS, and INTERRUPT or other control data fields (commonly referred to herein as control fields). Any READ or WRITE operation on a reserved BRAM 2b memory location generates a DMA transfer event vector. An event vector thus generated serves as FSM input at the receiving device, triggering a READ operation at associated control data fields. Control processing sequences are then executed by the receiving device based upon decoding of control data field contents. At termination of processing, the DMA control sequence is completed with the receiving device update of its own reserved control and status data fields. In this manner, potentially complex DMA control may be implemented based upon a simple encoding of BRAM 2b access events in combination with processing of encoded control data tokens residing at reserved BRAM 2b addresses. This new DMA structure is scalable, flexible, highly compact, and applicable to broad classes of IP cores.

It has already been noted in the proposed DMA scheme the IP core 6 is effectively mapped into the processor address space in BRAM 2b. One consequence of this is memory map information, namely memory addresses plus offsets at which specific READ/WRITE operations are to be performed, may be passed through the buffer. An example is communication of a specific buffer partition from the processor 4 to the IP core 6 via: (a) generation of memory pointers within context of a processor-resident application, (b) application of address data-type casts to the pointers, and (c) memory-map WRITE to the reserved DMA register locations. This memory map is subsequently read by the IP core FSM 10 as BRAM bit vector addresses, and may then be used to structure specific and highly complex DMA buffer operations.

According to embodiments of the present invention, STATUS, CONTROL, and INTERRUPT data fields may be extended more or less arbitrarily within the BRAM memory 2b. The decoder will be set to recognize this area based on the ADR, CS and WEN signals received and generate an event vector in response. If the address is outside the reserved memory area, the decoder will assume it is simply data being transferred, and no event vector will be generated. STATE information at a more or less arbitrary level of detail may be shared between the RISC processor 4 and a given IP Core 6. This provides a rich syntactical basis for construction of DMA control sequences. One possible application is management of multi-BUFFER sub-partitions within context of a multi-threaded processing model.

Figure 8:
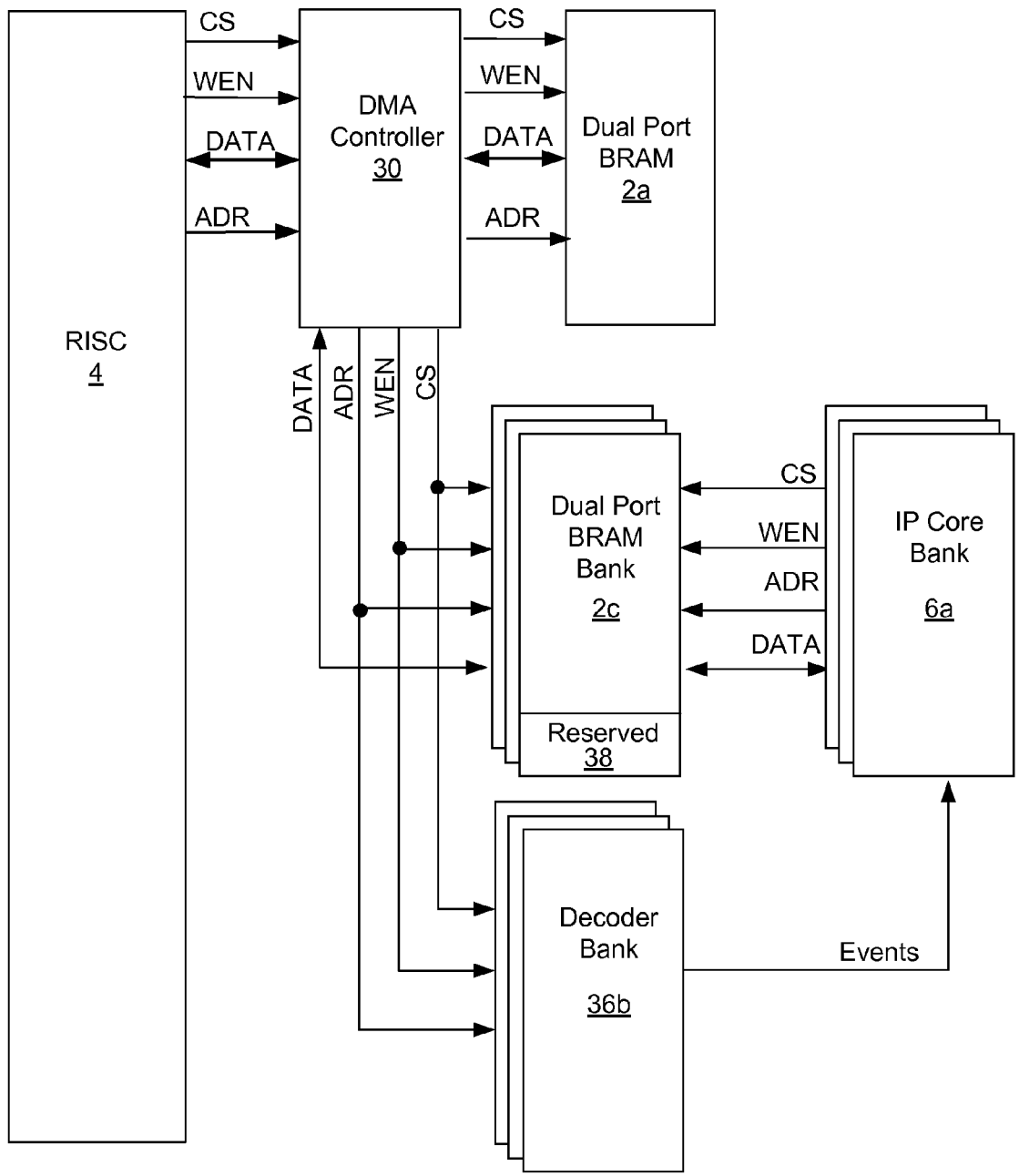
FIG. 8 illustrates scaling of the components of FIG. 5 to provide MASTER/SLAVE communication between a processor and multiple IP cores.

As shown in FIG. 8, the resulting DMA scheme scales in a fairly straightforward manner to multiple IP cores with addition of: (a) memory-mapped, dual-port BRAM elements 2c, and (b) DMA control (decoder) blocks 36b on a per-IP core 6a basis. The particular configuration shown in FIG. 8 is MASTER/SLAVE, but may be extended in obvious manner to SLAVE/MASTER, or PEER/PEER. Note the BRAM blocks 36b do not have to be the same size. Further, the simplicity and generic nature of the DMA control envelope suggests the decoder bank 36b may be merged into a single block. Further, instancing of the memory-mapped BRAM 2c on a per-IP core basis addresses a DMA scaling problem in that no access contention exists at the interface port between the BRAM 2c and the IP core 6a. Thus, DMA buffer READ/WRITE may in principle be concurrently performed by an arbitrary collection of IP cores, at essentially full access bandwidth.

Figure 9:
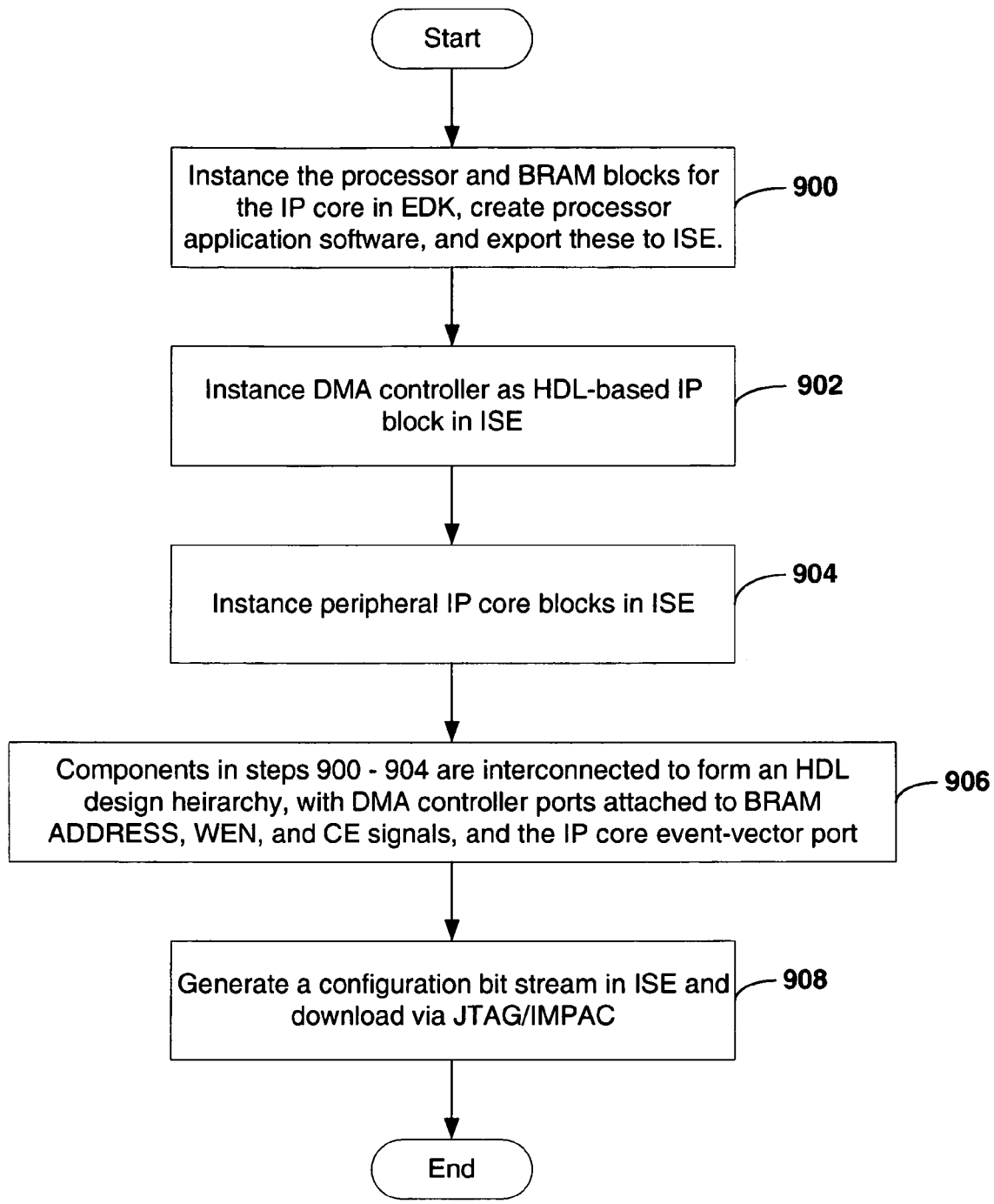
FIG. 9 is a flow chart showing one non-limiting example of steps for designing and instantiating a DMA-based system for communication between a processor and IP cores.

The proposed DMA implementation is straightforward and may easily be performed using existing commercially available tools. For example, the DMA arrangement may be implemented using the Embedded Developers Kit (EDK) and Integrated Software Environment (ISE) tools, both available from Xilinx, Inc. of San Jose, Calif. A flow chart for one non-limiting example is shown in FIG. 9. In the flow chart, the following steps are performed. In step 900, a processor plus memory-mapped BRAM blocks, (a single BRAM per IP core), are instanced in EDK. A processor software application is also created, and the partial design subsequently exported to ISE. In step 902, DMA controllers are instanced as HDL-based IP blocks in ISE. In step 904, selected peripheral IP core blocks are instanced in ISE. In step 906, all components determined in steps 900, 902, and 904 are interconnected to form an HDL design hierarchy, with a DMA controller ports attached to appropriate BRAM ADDRESS, WEN, and CE signals, and the IP core event-vector ports. Finally, in step 908 a configuration bitstream is generated in ISE and downloaded to an FPGA, for example via Joint Test Action Group (JTAG) or other configuration port.

The DMA side-channel controller control envelope minimally includes BRAM port address, Chip Select (CS), and Write Enable (WEN) signals on input, and output in form of an encoded 'event' vector. The event vector triggers state machine control operations in the processor or IP core. In particular, status, control, and interrupt register data fields (commonly referred to as control signals) are all mapped to reserved BRAM addresses and associated with unique event flags. In sum, with event decoding of READ/WRITE operations at reserved BRAM addresses and execution of processing sequences based upon control vectors residing at those locations, DMA control between the processor memory controller and IP core is stripped to the barest essentials. This compact control envelope is then employed for all IP cores provided in an FPGA as basis for implementation of full-featured DMA services at each IP core. This feature serves to address a fundamental DMA system-scaling problem, namely memory subsystem performance does not significantly degrade as DMA IP cores are added.

In essence, this DMA concept leverages an ability to map multiple dual-ported BRAM instances into the processor address space. In particular, every word in BRAM is accessible to the processor, via standard memory READ/WRITE operations. The processor then exploits this capability for communication with multiple IP cores. Full support is provided for: (a) buffer partitioning; (b) rate matching, and (c) block transfer, as dictated by arbitrarily complex Processor—IP core control signals provided in conjunction with the event vectors. One useful result is the IP core Applications Programming Interface (API) is rendered in the form of simple memory READ/WRITE at the associated BRAM addresses.

Embodiments of the invention describe a Direct Memory Access (DMA) subsystem implementation useful as a high performance alternative to BUS-based, or FIFO based FPGA platform/SoC designs. In particular, superior DMA data transfer performance may be achieved within the context of a multiple IP core plus embedded processor system while simultaneously realizing: (a) performance scaling across multiple DMA clients, (b) minimal logic/memory resource consumption, (c) highly simplified/generic control interface, (d) support for MASTER/SLAVE, SLAVE/MASTER, PEER/PEER control paradigms, and (e) a highly simplified Applications Programming Interface (API).

Although the present invention has been described above with particularity, this was merely to teach one of ordinary skill in the art how to make and use the invention. Many additional modifications will fall within the scope of the invention, as that scope is defined by the following claims.

What is claimed is:

1. A device comprising:
   a processor;
   at least one Intellectual Property (IP) core;
   a first memory;
   memory control logic connected between the processor and the first memory to transfer data and control signals;
   wherein the memory control logic provides direct memory access (DMA);
   at least one second memory connected between the memory control logic and the at least one IP core to transfer the data and control signals; and
   at least one decoder connected between the processor and the at least one IP core to signal transfer of control signals, the decoder providing an event vector output in response to storage of the control signals in the at least one second memory.

2. The device of claim 1, wherein the at least one decoder comprises:
   a first decoder for receiving the control signals from the at least one IP core and transmitting the event vector to the processor.

3. The device of claim 2, wherein the at least one decoder further comprises:
   a second decoder for receiving the control signals from the processor and transmitting the event vector to the at least one IP core.

4. The device of claim 1, wherein the at least one decoder comprises:
   a decoder for receiving the control signals from the processor and transmitting the event vector to the at least one IP core.

5. The device of claim 1, wherein the control signals transferred by the decoder comprise signals readable by a Finite State Machine (FSM) associated with the at least one IP core.

6. The device of claim 1, wherein a portion of the at least one second memory is reserved for the control signals.

7. The device of claim 1, wherein the decoder identifies the control signals and generates the event vector based on at least one signal selected from the group consisting of chip select (CS), write enable (WE) and address (ADR) signals provided when the control signals are stored in the memory.

8. The device of claim 1, wherein the first memory and the at least one second memory comprise block RAM of a Field Programmable Gate Array (FPGA).

9. A method for programming a communication interface between a processor and one or more Intellectual Property (IP) cores of a Field Programmable Gate Array (FPGA) comprising:
   programming logic of the FPGA to form a DMA controller to transfer data and control signals via the processor;
   configuring block RAM of the FPGA to form an interface to transfer data and control information between the DMA controller and the one or more IP cores;
   wherein the DMA controller is connected between the processor and the block RAM: and
   programming the logic of the FPGA to provide at least one decoder to transfer an event vector indicative of the data and control information between the one or more IP cores and the processor;
   wherein the at least one decoder is connected between the processor and the one or more IP cores.

10. The method of claim 9, further comprising:
    configuring the at least one decoder to receive the control signals from the one or more IP cores and transmit the event vector to the processor.

11. The method of claim 10, further comprising:
    configuring the at least one decoder to receive the control signals from the processor and transmit the event vector to the one or more IP cores.

12. The method of claim 9, further comprising:
    configuring the at least one decoder to receive the control signals from the processor and transmit the event vector to the one or more IP cores.

13. The method of claim 9, further comprising:
    configuring the at least one decoder to transfer the event vector to a Finite State Machine (FSM) associated with the one or more IP cores.

14. The method of claim 13, further comprising:
    configuring the DMA controller to transfer at least one signal selected from the group consisting of address, write enable and chip select signals to the at least one decoder, the decoder generating the event vector based on the at least one signal.

15. A processor readable storage medium for determining a communication component configuration of a Field Programmable Gate Array (FPGA) having a processor and one or more Intellectual Property (IP) cores, the processor readable medium including code to perform tasks comprising:
    instancing a processor and memory mapped block RAM (BRAM) portions for an IP core of the one or more IP cores;
    constructing and instancing a DMA memory controller;
    wherein the DMA memory controller is connected between the processor and the BRAM;
    constructing and instancing the IP core;
    instancing a decoder block to receive BRAM address, write enable, and chip enable signals, and generate an event vector,
    wherein the decoder block is connected between the processor and the IP core; and
    generating a configuration bitstream from the instanced processor, the DMA memory controller, the IP core, and the decoder block.

16. The processor readable medium of claim 15, wherein the decoder block provides the event vector to at least one of the IP core and the processor.

17. The processor readable medium of claim 15, further including code to perform the task comprising:
    downloading the configuration bitstream to the FPGA.

* * * * *